(12) United States Patent
Lawahmeh

(10) Patent No.: US 7,202,639 B2
(45) Date of Patent: Apr. 10, 2007

(54) APPARATUS FOR DETERMINING WEAR IN THE FRICTIONAL COMPONENTS OF AN ALTERNATOR

(75) Inventor: Ahmed Lawahmeh, Muncie, IN (US)

(73) Assignee: Remy International, Inc., Anderson, IN (US)

( * ) Notice: Subject to any disclaimer, the term of this patent is extended or adjusted under 35 U.S.C. 154(b) by 140 days.

(21) Appl. No.: 11/114,665

(22) Filed: Apr. 26, 2005

(65) Prior Publication Data

US 2006/0238171 A1 Oct. 26, 2006

(51) Int. Cl.
 *H02P 9/10* (2006.01)
(52) U.S. Cl. .............................. 322/37; 322/28; 322/99
(58) Field of Classification Search .................. 322/22, 322/23, 24, 28, 37, 29; 290/1 A, 5; 310/114, 310/115
 See application file for complete search history.

(56) References Cited

U.S. PATENT DOCUMENTS

| 3,351,845 | A | * | 11/1967 | Roof et al. ................... 322/87 |
| 4,168,459 | A | * | 9/1979 | Roesel, Jr. .................... 322/29 |
| 4,386,310 | A | * | 5/1983 | Sievers ......................... 322/28 |
| 4,413,222 | A | * | 11/1983 | Gansert et al. ............... 322/69 |
| 4,644,206 | A | * | 2/1987 | Smith ......................... 310/115 |
| 4,677,365 | A | * | 6/1987 | Yang ........................... 322/90 |
| 5,160,881 | A | * | 11/1992 | Schramm et al. .............. 322/7 |
| 5,225,764 | A | * | 7/1993 | Falater ......................... 322/28 |
| 5,710,471 | A | * | 1/1998 | Syverson et al. ............ 310/114 |
| 5,731,689 | A | * | 3/1998 | Sato ............................. 322/25 |
| 6,894,401 | B2 | * | 5/2005 | Beeson et al. ............... 290/1 A |

* cited by examiner

*Primary Examiner*—Nicholas Ponomarenko
(74) *Attorney, Agent, or Firm*—Ice Miller LLP

(57) ABSTRACT

An apparatus for determining wear in the frictional components of an alternator. Such an apparatus may comprise circuitry configured to count voltage peaks generated by the automotive alternator; circuitry configured to compare the counted voltage peaks against a predetermined standard; and circuitry configured to generate a warning indication when the counted voltage peaks exceeds the predetermined standard. Such an apparatus may comprise comprises circuitry configured to measure a voltage drop across the alternator brushes; circuitry configured to compare the voltage drop against a predetermined voltage drop criterion; and circuitry configured to generate a warning indication if the voltage drop exceeds the predetermined voltage drop criterion.

11 Claims, 2 Drawing Sheets

APPARATUS FOR DETERMINING WEAR IN THE FRICTIONAL COMPONENTS OF AN ALTERNATOR

BACKGROUND

FIG. 1 shows a partially cut away view of a conventional alternating current generator, or "alternator," such as the type used in conjunction with an internal combustion engine in a motor vehicle. The alternator shown in FIG. 1 comprises housing 37 which encloses rotor 11, stator 15, and rectifier bridge 31.

Rotor 11 comprises rotor core 43 mounted on rotor shaft 33. Pulley 35 is mounted on the end of rotor shaft 33 outside housing 37. Field winding 13 surrounds rotor core 43. Field winding is surrounded by a pair of interlocking "clawfoot" iron shells 19, 21.

Field winding 13 is connected to a pair of copper slip rings 23, 25 mounted concentrically on rotor shaft 33. Slip rings 23, 25 rotate as rotor shaft 33 rotates. Stationary carbon brushes 27, 29 are held in contact with slip rings 23, 25, respectively. In operation, an electric current is passed through field winding 13 via carbon brushes 27, 29 and slip rings 23, 25. When field winding 13 is energized, one of the interlocking iron shells becomes a magnetic "north," and the other interlocking iron shell becomes a magnetic "south." The interlocking nature of the shells results in a plurality of alternating north poles and south poles.

Stator 15 is a stationary steel core holding stator windings 17. The stator windings usually (but not always) consist of three individual sets of windings connected in a delta or wye configuration. Rotor 11 is rotated within stator 15, typically by application of a rotational force to pulley 35. Bearings 39, 41 are interposed between rotor shaft 33 and housing 37, and support rotor shaft 33 as it rotates. As rotor 11 rotates, the rotating alternating north and south poles induce an alternating current in stator windings 17.

Rectifier bridge 31 is electrically connected to stator windings 17. Rectifier bridge 31 converts the alternating current produced by stator windings 17 into direct current that is useable to charge a battery (not shown) and/or to supply other electric loads. In a motor vehicle application, a battery (not shown) typically is connected in parallel with rectifier bridge 31 to deliver adequate electric current to any electric loads when rotor 11 is not rotating or when rotor 11 is rotating too slowly to result in a voltage equal to the battery voltage. When the rotor 11 rotates at an increased speed, a voltage results across the battery terminals that is greater than the battery voltage, and the battery thereby is re-charged.

A typical alternator also comprises a voltage regulator (not shown in FIG. 1). A voltage regulator is an electronic circuit that senses the output voltage from the alternator. If the voltage regulator detects that the output voltage is low, it will supply additional current to field winding 13. The increased current enhances the strength of the rotor's magnetic field, thereby increasing the output voltage from the alternator. Likewise, if the voltage regulator detects that the output voltage is high, it will reduce the current supplied to field winding 13. The reduced current weakens the rotor's magnetic field, thereby decreasing the output voltage put from the alternator.

In a typical application, the alternator's rotor shaft can rotate at about 6000–9000 rpm. The rotation of the rotor shaft subjects bearings 39, 41 and carbon brushes 27, 29 to frictional wear, which degrades the performance of the rotor shaft bearings and the carbon brushes over time. Ultimately, the degraded rotor shaft bearings and/or carbon brushes can result in an unanticipated failure of the alternator, disabling the vehicle in which the alternator is installed.

A vehicle unexpectedly disabled by an alternator failure always is troublesome. However, an unexpected alternator failure is particularly problematic for trucks and other vehicles involved in transportation and logistics. A disabled vehicle may result in millions of dollars in lost productivity or products. Assembly lines can be idled if parts are not available. Perishable materials can expire. Accordingly, it is desired to provide a method and apparatus for predicting the failure of the frictional components of an alternator.

SUMMARY

The present invention comprises a method and apparatus for predicting the failure of the alternator brushes and/or bearings. In an embodiment, the present invention comprises an apparatus for use in conjunction with an automotive alternator. The apparatus of this embodiment comprises circuitry configured to count voltage peaks generated by the automotive alternator; circuitry configured to compare the counted voltage peaks against a predetermined standard; and circuitry configured to generate a warning indication when the counted voltage peaks exceeds the predetermined standard. An aspect of this embodiment comprises a memory that is electrically connected to the circuitry configured to compare the counted voltage peaks against the predetermined standard. The predetermined standard is stored in the memory. In an aspect of this embodiment, the circuitry configured to count voltage peaks generated by the automotive alternator comprises a microprocessor. In an aspect of this embodiment, the circuitry configured to compare the counted voltage peaks against a predetermined standard count comprises a microprocessor. In an aspect of this embodiment, the warning indication comprises a visible or audible signal.

In an embodiment, the present invention comprises an apparatus for use in conjunction with an automotive alternator, wherein the alternator comprises electrically conductive alternator brushes. The apparatus of this embodiment comprises circuitry configured to measure a voltage drop across the alternator brushes; circuitry configured to compare the voltage drop against a predetermined voltage drop criterion; and circuitry configured to generate a warning indication if the voltage drop exceeds the predetermined voltage drop criterion. An aspect of this embodiment further comprises a memory, the memory electrically connected to the circuitry configured to compare the voltage drop against the predetermined voltage drop criterion, the predetermined voltage drop criterion being stored in the memory. In an aspect of this embodiment, the circuitry configured to measure a voltage drop across the alternator brushes comprises a microprocessor. In an aspect of this embodiment, the circuitry configured to compare the voltage drop against a predetermined voltage drop criterion comprises a microprocessor. In an aspect of this embodiment, the warning indication comprises a visible or audible signal.

BRIEF DESCRIPTION OF THE DRAWINGS

The features and advantages of this invention, and the manner of attaining them, will be more apparent and better understood by reference to the following descriptions of embodiments of the invention, taken in conjunction with the accompanying drawings, wherein.

DESCRIPTION

The present invention comprises a method and apparatus for predicting the failure of the alternator brushes and/or bearings.

In an embodiment of the present invention, the number of rotor revolutions are counted and compared against a predetermined estimate of number of rotor revolutions over the expected of the lifespan of the alternator brushes and/or bearings. After a predetermined number of rotor revolutions, a warning indication is generated alerting the owner or operator of the alternator that preventative maintenance is recommend for the alternator brushes and/or bearings. For example, an audible or visible message or warning can be sent to the owner or operator of the alternator indicating the estimated remaining life of the brushes, bearings, or alternator. In another example, a warning light or LED within the vehicle in which the alternator is installed can be activated to indicate the need for replacing the brushes, bearings, or alternator.

An alternator produces an alternating voltage signal. The alternating voltage signal produced by the alternator is comprises a series of voltage peaks. The number of rotor revolutions can be computed from the alternating voltage signal by first sensing the voltage peaks in the alternating voltage signal, and then dividing the number of sensed voltage peaks by the number of magnetic pole pairs. For example, in a twelve pole alternator there are six pairs of magnetic poles (one positive and one negative pole per pair). Every six voltage peaks equates to one revolution of the rotor.

An embodiment of the present invention counts the voltage peaks in the alternating voltage signal. The voltage peak count then is compared to a statistic that represents a predetermined estimate of voltage peaks generated by the alternator over the expected lifespan of the alternator brushes and/or bearings. After a predetermined number of voltage peaks, a warning indication is generated alerting the owner or operator of the alternator that preventative maintenance or replacement is recommend for the brushes, bearings, or alternator.

Figure 1:
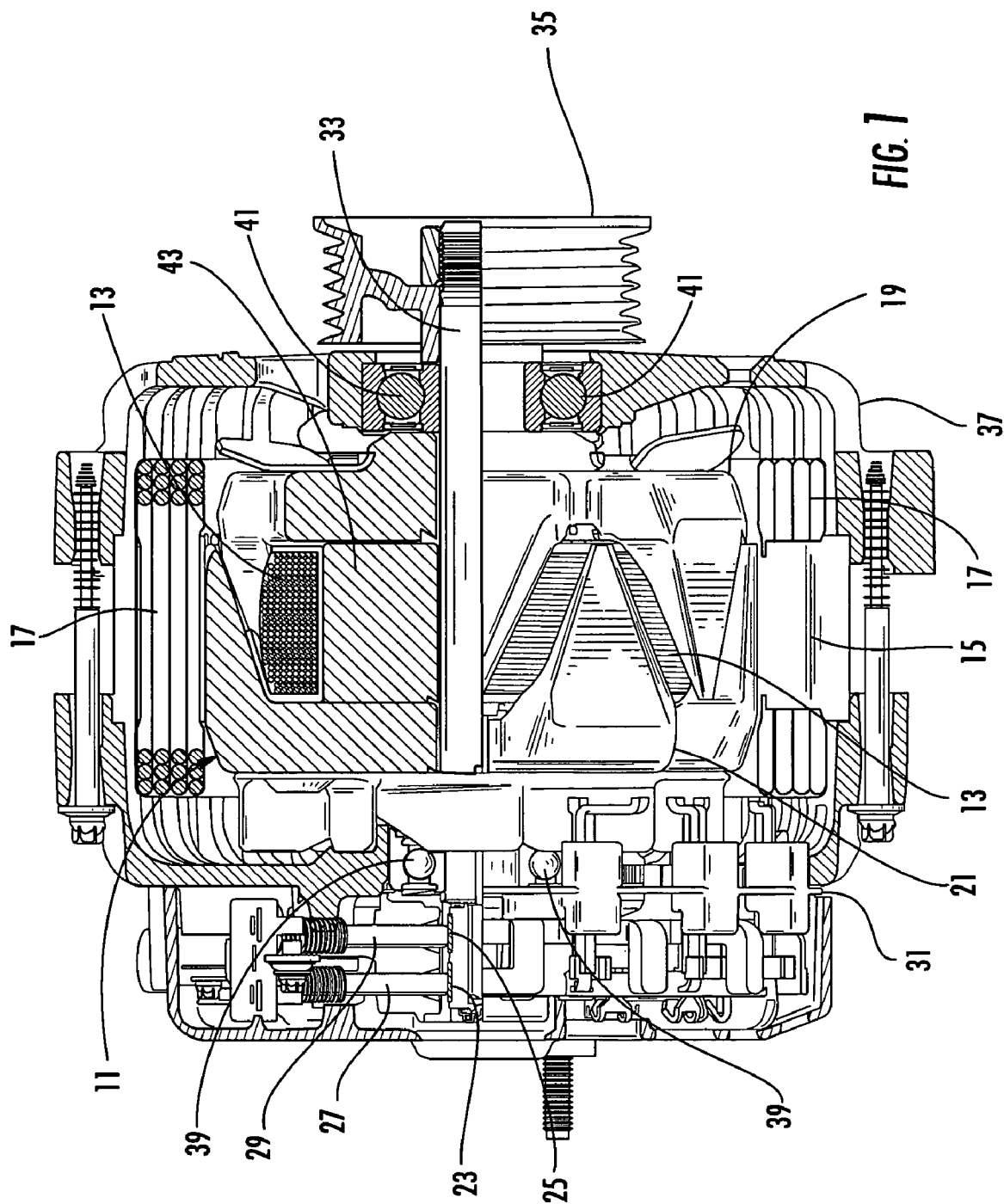
FIG. 1 shows a cross-sectional view of a conventional alternating current generator.
Figure 2:
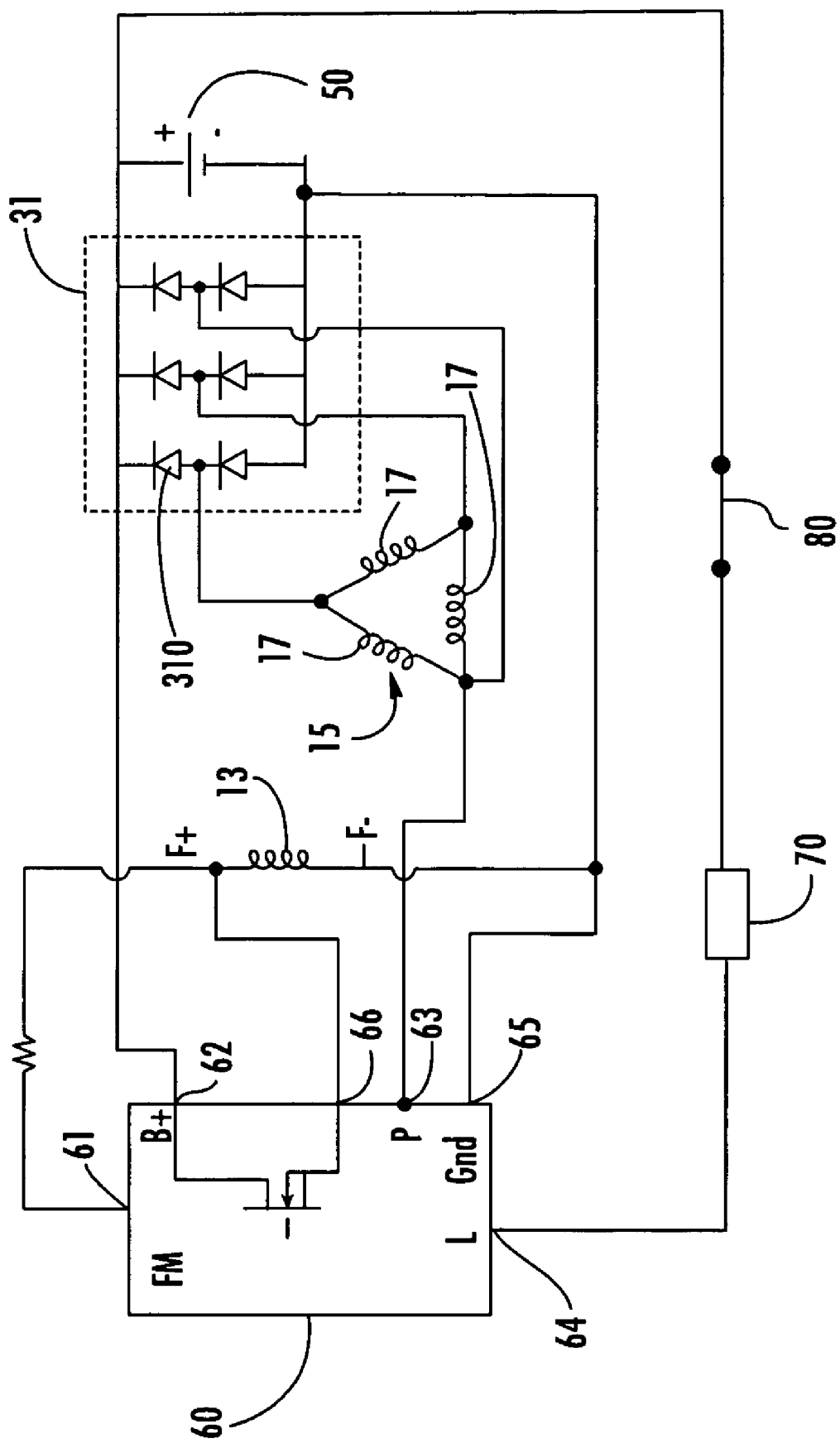
FIG. 2 shows a schematic of an alternator and voltage regulator according to an embodiment of the present invention.

FIG. 2 shows a schematic of an alternator and voltage regulator according to an embodiment of the present invention. The embodiment of the present invention shown in FIG. 2 comprises field winding 13, stator 15, bridge rectifier 31, battery 50, voltage regulator 60, warning lamp 70, and ignition switch 80 (shown closed in FIG. 2). Stator 15 comprises three stator windings 17, connected in delta fashion. Bridge rectifier 31 comprises six diodes 310. Regulator 60 comprises terminal 61, terminal 62, terminal 63, terminal 64, terminal 65, and terminal 66. All items are electrically interconnected as shown in FIG. 2.

In operation, voltage regulator 60 performs its typical function of monitoring the alternator's voltage output and adjusting the current supplied to field winding 13 in response to changes in the alternator's voltage output. In addition, voltage regulator 60 according to the present invention is adapted with circuitry and software to enable voltage regulator 60 to sense the voltage peaks in the alternating voltage signal generated by the alternator. Such voltage peaks are sensed by voltage regulator 60 at terminal 63. Circuitry and software within voltage regulator 60 counts the voltage peaks sensed by voltage regulator 60 at terminal 63, and records the count in an electronic memory circuit. Such circuitry may comprise a microprocessor. Circuitry and software within voltage regulator 60 compare the voltage peak count against a statistic that represents a predetermined estimate of voltage peaks generated by the alternator over the expected lifespan of the alternator brushes and/or bearings. Such circuitry may comprise a microprocessor. Voltage regulator 60 may comprise a memory in which this statistic is stored. After a predetermined number of voltage peaks are counted by voltage regulator 60, a switch within voltage regulator 60 closes, causing warning lamp 70 to illuminate.

In another embodiment, the present invention comprises a method and apparatus for predicting the failure of alternator brushes. As the rotor rotates, the stationary carbon brushes are held in contact with the rotating slip rings so that electricity can flow through the field winding while the rotor rotates. Friction between the slip rings and the brushes causes the brushes to wear, increasing the resistance in the electrical connection between the slip rings and the brushes. The field winding produces a weaker magnetic field unless the current flowing to the field winding is increased to compensate for the increased resistance. The weaker magnetic field produced by the field winding results in reduced voltage output by the alternator.

The apparatus shown in FIG. 2 may be adapted for this embodiment of the present invention. In operation of this embodiment, voltage regulator 60 performs its typical function of monitoring the alternator's voltage output and adjusting the current supplied to field winding 13 in response to changes in the alternator's voltage output. In addition, voltage regulator 60 according to the present invention is adapted with circuitry and software to enable voltage regulator 60 to measure the voltage drop across the brushes, or across the brushes and slip rings. Such circuitry may comprise a microprocessor. The voltage drop measurement can be conducted automatically when the alternator is at idle and or when the rotor rotating. Circuitry and software within voltage regulator 60 compare the voltage drop against a statistic that represents the maximum acceptable voltage drop. Such circuitry may comprise a microprocessor. Voltage regulator 60 may comprise a memory in which this statistic is stored. Where the measured voltage drop exceeds the maximum acceptable voltage drop, a switch within voltage regulator 60 closes, causing warning lamp 70 to illuminate.

The various circuitry and software recited herein and in the claims may be performed by computer software and/or computer hardware. Such computer software may be written in a well known programming language such as, for example, Basic, C, C++, Fortran, JavaScript, Java, Pascal, PERL, or SQL, or a combination of any of the foregoing or the equivalents thereof.

While this invention has been described as having a preferred design, the present invention can be further modified within the scope and spirit of this disclosure. This application is therefore intended to cover any variations, uses, or adaptations of the invention using its general principles. For example, the methods disclosed herein and in the appended claims represent one possible sequence of performing the steps thereof. A practitioner of the present invention may determine in a particular implementation of the present invention that multiple steps of one or more of the disclosed methods may be combinable, or that a different sequence of steps may be employed to accomplish the same results. Each such implementation falls within the scope of the present invention as disclosed herein and in the appended claims. Furthermore, this application is intended to cover such departures from the present disclosure as come within known or customary practice in the art to which this invention pertains and which fall within the limits of the appended claims.

I claim:

1. An apparatus for use in conjunction with an automotive alternator, the alternator comprising electrically conductive alternator brushes, the apparatus comprising:
   circuitry configured to count voltage peaks generated by said automotive alternator;
   circuitry configured to compare said counted voltage peaks against a predetermined standard;
   circuitry configured to generate a warning indication when said counted voltage peaks exceeds said predetermined standard;
   circuitry configured to measure a voltage drop across said alternator brushes;
   circuitry configured to compare said voltage drop against a predetermined voltage drop criterion; and
   circuitry configured to generate a warning indication if said voltage drop exceeds said predetermined voltage drop criterion.

2. The apparatus of claim 1, further comprising:
   a memory, said memory electrically connected to said circuitry configured to compare said counted voltage peaks against said predetermined standard, said predetermined standard being stored in said memory.

3. The apparatus of claim 1, wherein said circuitry configured to count voltage peaks generated by said automotive alternator comprises a microprocessor.

4. The apparatus of claim 1, wherein said circuitry configured to compare said counted voltage peaks against a predetermined standard count comprises a microprocessor.

5. The apparatus of claim 1, wherein said warning indication comprises a visible signal.

6. The apparatus of claim 1, wherein said warning indication comprises an audible signal.

7. The apparatus of claim 1, further comprising:
   a memory, said memory electrically connected to said circuitry configured to compare said voltage drop against said predetermined voltage drop criterion, said predetermined voltage drop criterion being stored in said memory.

8. The apparatus of claim 1, wherein said circuitry configured to measure a voltage drop across said alternator brushes comprises a microprocessor.

9. The apparatus of claim 1, wherein said circuitry configured to compare said voltage drop against a predetermined voltage drop criterion comprises a microprocessor.

10. The apparatus of claim 1, wherein said warning indication comprises a visible signal.

11. The apparatus of claim 1, wherein said warning indication comprises an audible signal.

* * * * *